United States Patent [19]

Tomita et al.

[11] Patent Number: 4,626,689
[45] Date of Patent: Dec. 2, 1986

[54] ELECTRON BEAM FOCUSING SYSTEM FOR ELECTRON MICROSCOPE

[75] Inventors: Takeshi Tomita; Yu Ishibashi, both of Tokyo, Japan

[73] Assignee: JEOL Ltd., Tokyo, Japan

[21] Appl. No.: 743,014

[22] Filed: Jun. 10, 1985

[30] Foreign Application Priority Data

Jun. 16, 1984 [JP] Japan .................. 59-123993

[51] Int. Cl.$^4$ .............................. H01J 29/46
[52] U.S. Cl. .................. 250/396 R; 250/310
[58] Field of Search .......... 250/396 R, 311, 310, 250/396 ML, 400

[56] References Cited

U.S. PATENT DOCUMENTS

| | | | |
|---|---|---|---|
| 2,457,092 | 12/1948 | Simard et al. | 250/396 |
| 3,715,582 | 2/1973 | Akahori et al. | 250/311 |
| 4,160,162 | 7/1979 | Müller et al. | 250/396 R |

FOREIGN PATENT DOCUMENTS

2118771/A  4/1983  United Kingdom ............... 250/311

OTHER PUBLICATIONS

Introduction to Analytical Electron Microscopy, Edited by John J. Hren et al., Chapters 14 and 15.

Primary Examiner—Craig E. Church
Assistant Examiner—T. N. Grigsby
Attorney, Agent, or Firm—Webb, Burden, Robinson & Webb

[57] ABSTRACT

When a transmission-type electron microscope is used to make an observation of a diffraction image produced by a focused electron beam, it is desired that the divergence angle of the electron beam be varied at will while maintaining the spot diameter of the beam on a specimen constant. The present invention provides three stages of focusing lenses and a means for controlling these lenses in interrelated manner in a space between an objective lens and an electron gun in which the specimen is placed. The three stages of lenses are designed to be controlled independently. When an operation is performed to increase the divergence angle of the electron beam, the excitations of the first and second stages of focusing lenses are reduced while the excitation of the third stage of focusing lens is increased, thus maintaining the spot diameter of the beam on the specimen constant.

7 Claims, 15 Drawing Figures

ELECTRON BEAM FOCUSING SYSTEM FOR ELECTRON MICROSCOPE

DESCRIPTION

BACKGROUND OF THE INVENTION

The present invention relates to an electron beam focusing system that is used for a transmission-type electron microscope to focus the electron beam from the electron gun before the beam impinges (irradiates) upon a specimen.

Observations of diffraction images produced by focused electron beams using an electron microscope have been widely made. FIG. 1 shows an electron emission and focusing system which is used for a conventional electron microscope or the like to observe a diffraction image produced by a focused electron beam. This system includes an electron gun 1 that produces an electron beam 2, which is focused by a first stage focusing (condenser) lens 3. The focused beam then passes through a movable diaphragm (aperture plate) 4, and is focused by a second stage focusing lens 5. Thereafter, the beam is focused by a front magnetic field lens 6a in an objective lens 6, and then it impinges upon a specimen 7. The beam is diffracted by the specimen 7 and brought to focus by means of a rear magnetic field lens 6b in the objective lens and an imaging lens system (not shown) that is mounted at the rear of the lens 6b. Thus, the beam is projected onto a fluorescent screen 8, focusing a diffraction (pattern) image. To observe such a diffraction image, the following requirements must be met.

(1) In order to read information as much as possible from a diffraction disk 9 projected onto the fluorescent screen 8, the diameter d of the disk must be maximized in such a way that neighboring diffraction disks are not superimposed on each other.

(2) In order that the obtained diffraction electron beam come from a perfect region of a crystal, the diameter of the spot of the beam falling on the specimen must be kept at an initially set, small value.

The diameter d of a diffraction disk depends on the divergence angle $2\alpha$ of the electron beam that irradiates the specimen 7. Accordingly, the divergence angle $2\alpha$ is required to be adjusted to satisfy the aforementioned requirements. For simplicity, $\alpha$ that is half the divergence angle will be hereinafter referred to as divergence angle.

As one conceivable method of adjusting the divergence angle $\alpha$, the excitation magnitudes of focusing lenses are adjusted. However, the aforementioned prior art electron emission and focusing system is equipped with only two stages of focusing lenses. Therefore, if the excitation magnitudes of two stages of focusing lenses are varied, the total magnification of these two lenses will change, leading to a change in the diameter of the spot of the electron beam. As a result, requirement (2) above will not be fulfilled. For this reason, the common practice adopted to adjust the divergence angle is to exchange the movable diaphragm for another and alter the diameter of the aperture without changing the excitation magnitudes of the focusing lenses. This makes it impossible to adjust the divergence angle finely. Thus, it has not been possible to observe an electron beam diffraction image by magnifying a diffraction disk to an appropriate size. Although a focusing lens system equipped with three stages of focusing lenses actually exists, the focusing lenses whose excitation magnitudes are varied are only two. Consequently, this system has substantially the same problems as the two-stage focusing lens system. These are described in "Introduction to Analytical Electron Microscopy" Plenum Press, 1979, Chapters 14 and 15.

SUMMARY OF THE INVENTION

It is the main object of the present invention to provide an electron microscope which is capable of arbitrarily adjusting the divergence angle of an electron beam while maintaining the diameter of the spot of the beam falling upon a specimen constant.

This object is achieved by an electron beam emission and focusing system having: an electron gun; first, second, and third stages of focusing lenses for focusing the electron beam from the electron gun; first, second, and third adjustable power supplies for respectively exciting the first, second, and third stages of lenses; and an objective lens for focusing the electron beam passed through the three lenses onto a specimen. The system is further characterized by the provision of a control means for changing the excitation currents supplied to the lens from the three power supplies in interrelated manner to thereby change the divergence angle of the electron beam while maintaining the spot diameter of the beam falling upon the specimen constant.

The concept underlying the invention is next described by referring to FIG. 2. We now consider a focusing lens system which consists of three stages of focusing lenses 10, 11, 12 together with a diaphragm 13 disposed near the center of the second stage of focusing lens 11. Note that those components of FIG. 2 which are the same as components of FIG. 1 are indicated by the same reference numerals as in FIG. 1. Excitation magnitudes of focusing lenses 10–12 are so adjusted that the electron beam follows the trajectory of the electron beam indicated by the broken lines in FIG. 2. The electron gun 1 is $a_1$ away from the first stage of focusing lens 10. A first crossover is formed by focusing the beam at a distance $b_1$ from the first stage of focusing lens 10 to form an image $I_1$. This image $I_1$ is again brought to focus by the second stage of focusing lens 11 at a distance $b_2$ from the lens 11 to form an image $I_2$. The lens 11 is at a distance $a_2$ from the image $I_1$. The image $I_2$ is again brought to focus by the third stage of focusing lens 12 at a distance $-b_3$ from the lens 12 to form an enlarged virtual image $I_3$, the lens 12 being at a distance $a_3$ from the image $I_2$. The virtual image $I_3$ is again brought to focus by the front magnetic field lens 6a on the specimen 7 at a distance $b_0$ from the lens 6a in the objective lens 6 to form an image $I_0$, the lens 6a being at a distance $a_0$ from the virtual image $I_3$. The diameter r of the spot of the electron beam falling on the specimen 7 is given by $$r = A \cdot (b_1/a_1) \cdot (b_2/a_2) \cdot (b_3/a_3) \cdot (b_0/a_0) \quad (1)$$

where A is the radius of the electron beam source in the electron gun 1.

Where R is the radius of the diaphragm 13, $l_3$ is the maximum distance between the electron beam passing through the third stage of lens 12 and the optical axis C, and $l_0$ is the maximum distance between the electron beam passing through the front magnetic field lens 6a and the optical axis C, the divergence angle $\alpha$ of the electron beam impinging on the specimen 7 is given by $$a \simeq l_0/b_0 \tag{2}$$

Since $l_0/a_0 = l_3/b_3$ and $3/a_3 = R/b_2$, formula (2) above can be modified as follows:

$$a \simeq (a_0/b_0) \cdot (R \cdot a_3)/(b_2 \cdot b_3) \tag{3}$$

Usually, the magnification of the front magnetic field lens of an electron microscope is maintained constant, and therefore $a_0/b_0$ can be regarded as constant. Also, we assume that the radius R of the diaphragm 13 is retained constant. Thus, we can see that the divergence angle $\alpha$ is proportional to $a_3/(b_2 b_3)$.

In order to reduce the value of $\alpha$ down to $1/K$ (K is an arbitrary positive number), $b_2$, $a_3$, $b_3$ are changed in the manner described below. We select $b_2'$, $a_3'$, $b_3'$ instead of $b_2$, $a_3$, $b_3$. These factors are interrelated by $$a_3'/(b_2' \cdot b_3') = (1/K)\{a_3/(b_2 \cdot b_3)\} \tag{4}$$

The excitation magnitudes of the three stages of focusing lenses 10, 11, 12 are varied in interrelated manner such that new factors $a_1'$, $b_1'$, $a_2'$ are selected. These factors are interrelated by $$(a_1' a_2')/b_1' = K(a_1 a_2)/b_1 \tag{5}$$

Making use of formulas (4) and (5), we have $$r = A \cdot (b_1'/a_1')(b_2'/a_2') \times (b_3'/a_3')(b_0'/a_0') \tag{6}$$

Therefore, we can understand that $\alpha$ can be arbitrarily varied while keeping the radius r of the electron beam spot constant. In this case, the path of the electron beam is indicated by the dot-and-dash line in FIG. 2.

PREFERRED EMBODIMENT OF THE INVENTION

Figure 1:
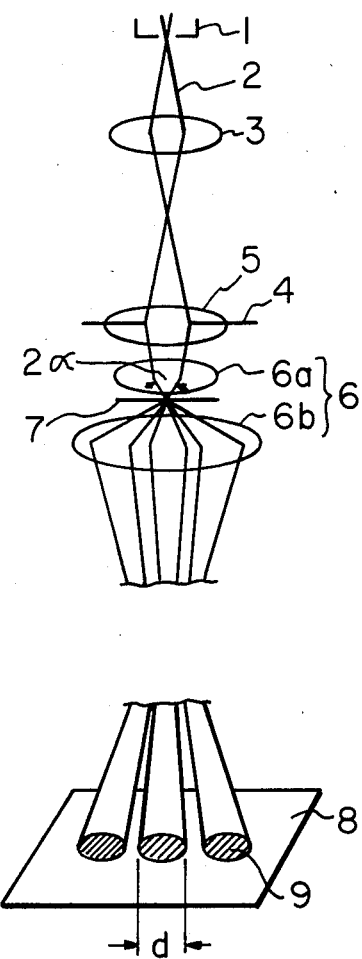
FIG. 1 is a diagram showing a conventional electron beam emission and focusing lens system.
Figure 2:
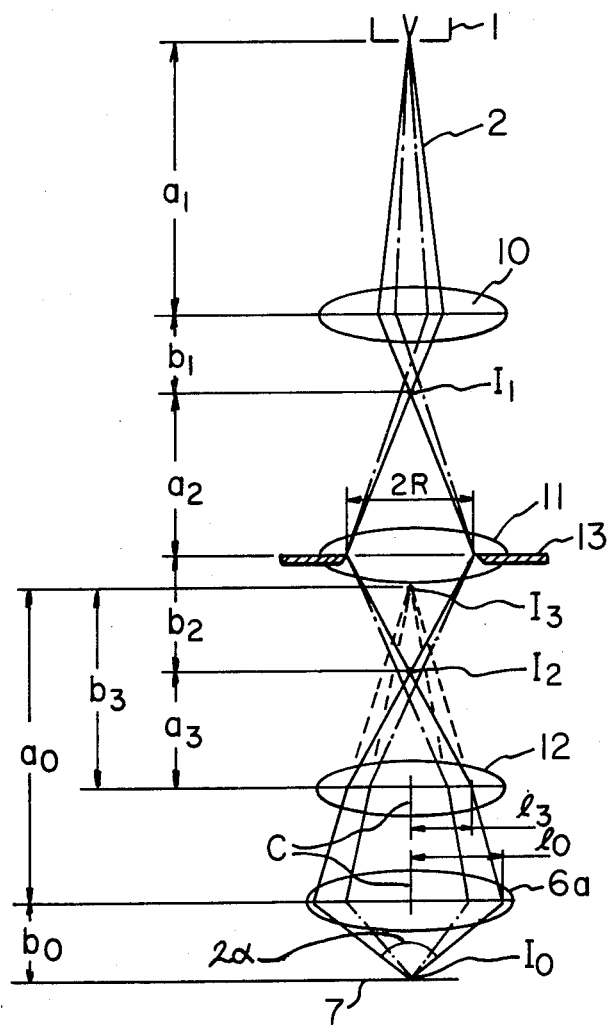
FIG. 2 is a diagram for illustrating the principle of the present invention.
Figure 3:
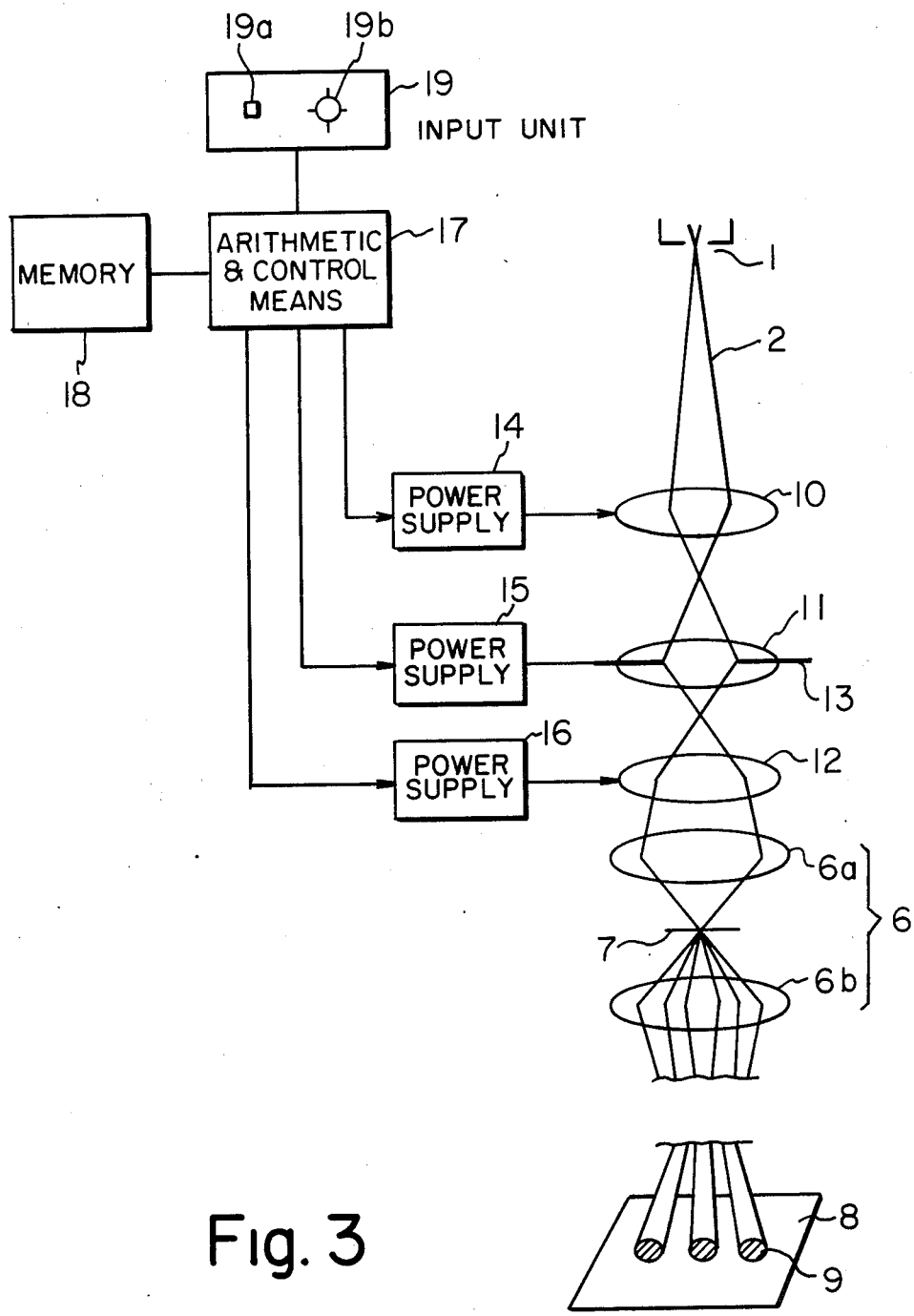
FIG. 3 is a diagram showing one example of the invention.

Referring to FIG. 3, there is shown one example of the invention. It is to be noted that like components are denoted by like reference numerals in both FIGS. 1 and 3. The instrument shown in FIG. 3 includes adjustable power supplies 14, 15, 16 for exciting three stages of focusing lenses 10, 11, 12, respectively. Electric currents supplied from the power supplies 14–16 to the lenses 10–12 are controlled by the control signal from an arithmetic and control unit 17. This unit 17 can establish a current value control mode in which the current of the electron beam striking the specimen can be varied, as well as the divergence angle control mode disclosed and claimed herein. Connected to the unit 17 is a memory 18, in which sets of data items that are necessary when the unit 17 is placed in the divergence angle control mode are stored. Each set of data items forms a table, and contains a divergence angle and signals indicating the excitation magnitudes of the focusing lenses 10–12. The magnitudes are so set that the divergence angle is attained according to the spot diameter of, for example about 70 Å that is to be kept constant.

Figure 4A:
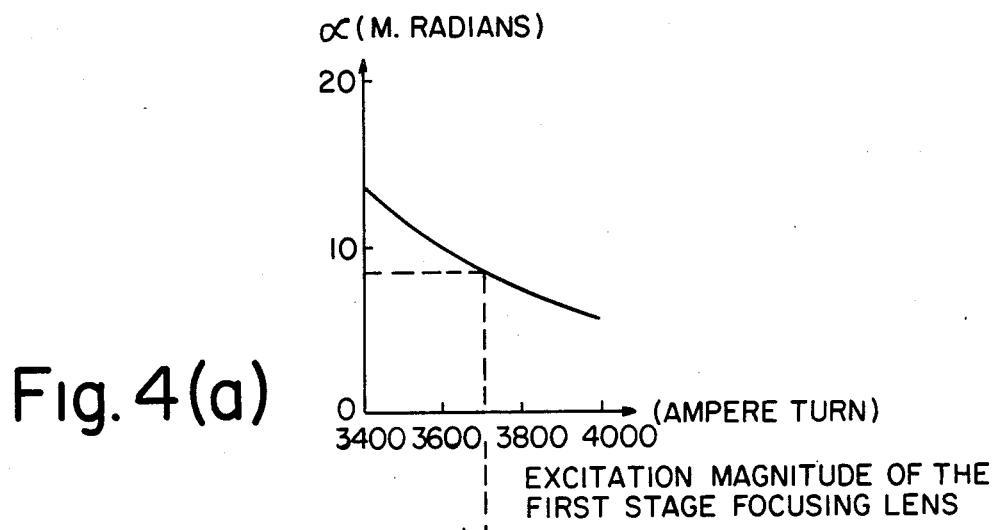
FIGS. 4–6 are graphs showing magnitudes of excitation currents supplied from power supplies to focusing lenses against specified divergence angles stored in a memory.
Figure 4B:
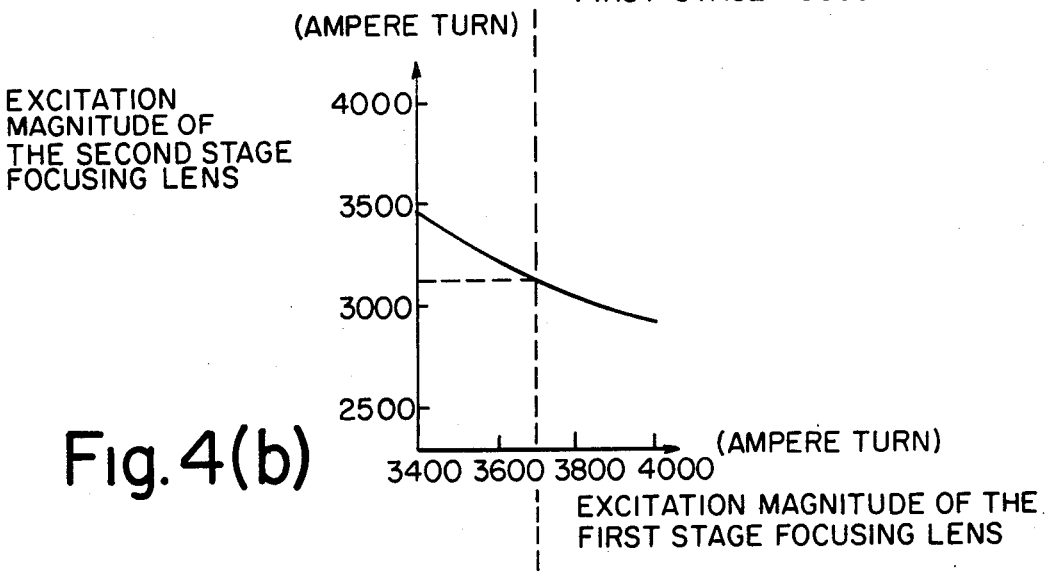
Figure 4C:
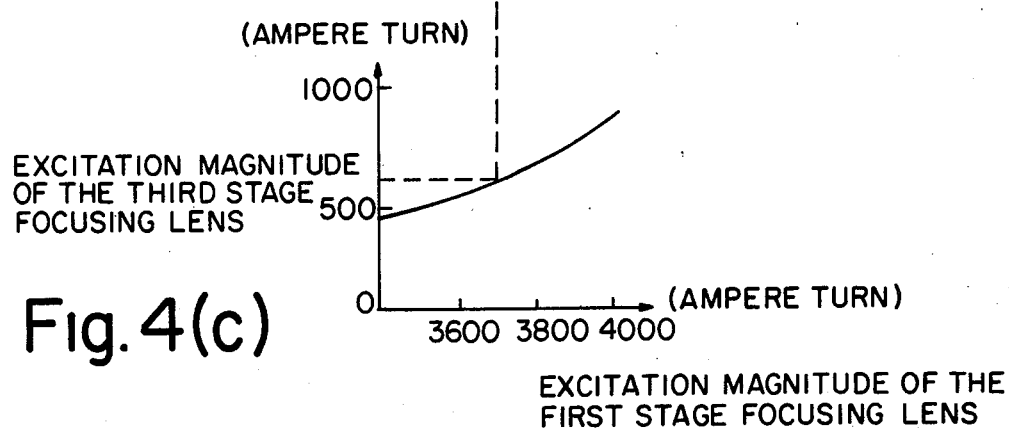

FIGS. 4(a), 4(b), and 4(c) are graphs specifically showing these tables, i.e., the stored data items. In FIG. 4(a), the excitation magnitude (ampere-turn) of the first stage of focusing lens 10 is represented on the horizontal axis, whereas the divergence angle $\alpha$ (m radians) of the electron beam is represented on the vertical axis. The graph of FIG. 4(a) indicates the value to be assumed for the excitation magnitude of the first stage of focusing lens 10 when the divergence angle of the electron beam has been set to an arbitrary value. The relation (given by the graph of FIG. 4(c)) between the divergence angle and the excitation magnitude of the first stage of focusing lens 10 is stored in the memory 18. The excitation magnitude of the first stage of focusing lens 10 is given on the horizontal axis of the graph of FIG. 4(b), and the excitation magnitude of the second stage of focusing lens 11 is represented on the vertical axis. The graph of FIG. 4(b) indicates the value that is to be taken for the excitation magnitude of the second stage of focusing lens 11 according to the value of the excitation magnitude of the first stage of focusing lens 10 after the latter value has been set. Similary, FIG. 4(c) shows the excitation magnitude of the third stage of focusing lens that is to be set against the excitation magnitude of the first stage of focusing lens 10. The relations given by the graphs of FIGS. 4(b) and 4(c) are also stored in the memory 18.

Figure 5A:
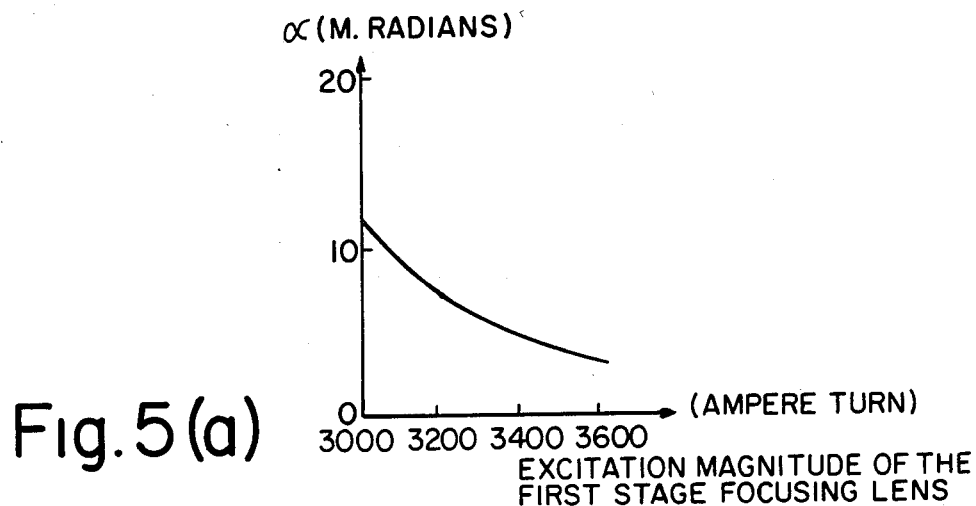
Figure 5B:
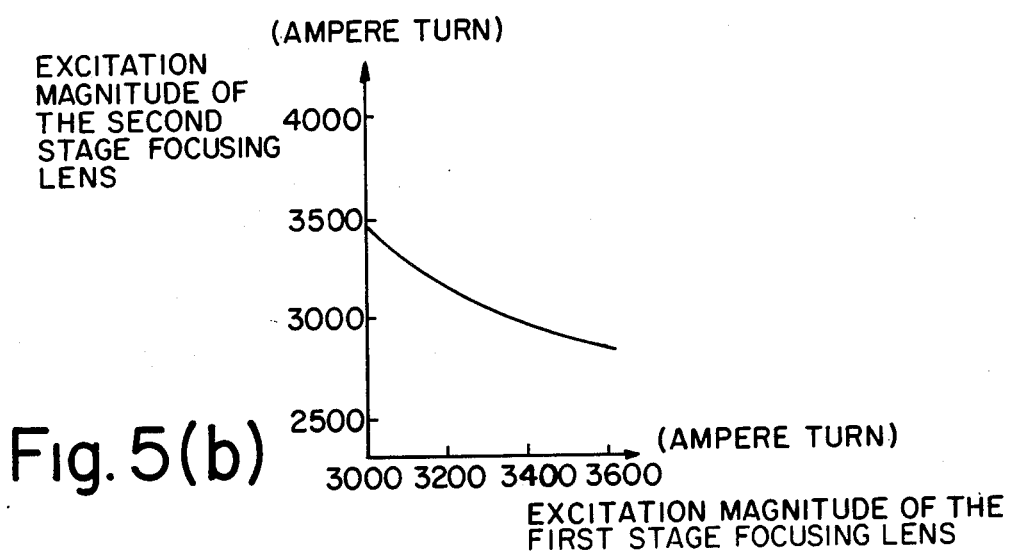
Figure 5C:
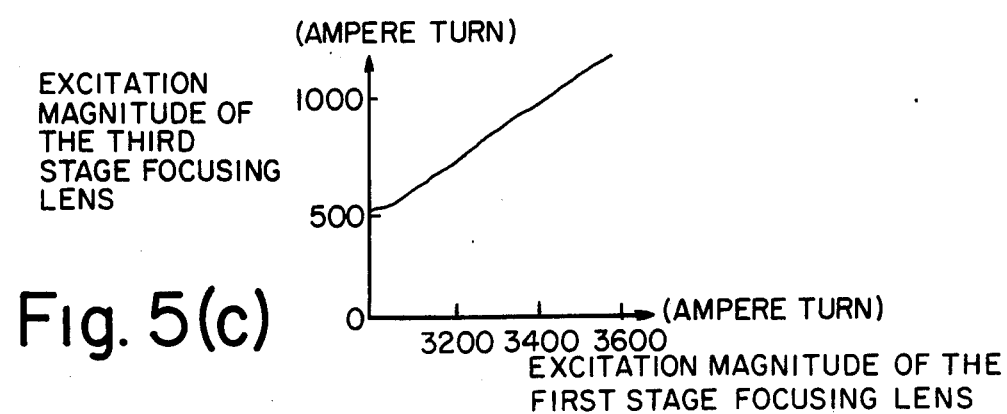

FIGS. 5(a), 5(b), and 5(c) are graphs showing the excitation magnitudes of the first, second, and third stages of focusing lenses which are needed to achieve an arbitrary value of divergence angle $\alpha$ when the spot diameter is maintained at a value of approximately 200 Å. These three graphs correspond to the graphs of FIGS. 4(a), 4(b), 4(c), respectively. The relationships given by the graphs of FIGS. 5(a), 5(b), 5(c) are also stored in the memory 18.

Figure 6A:
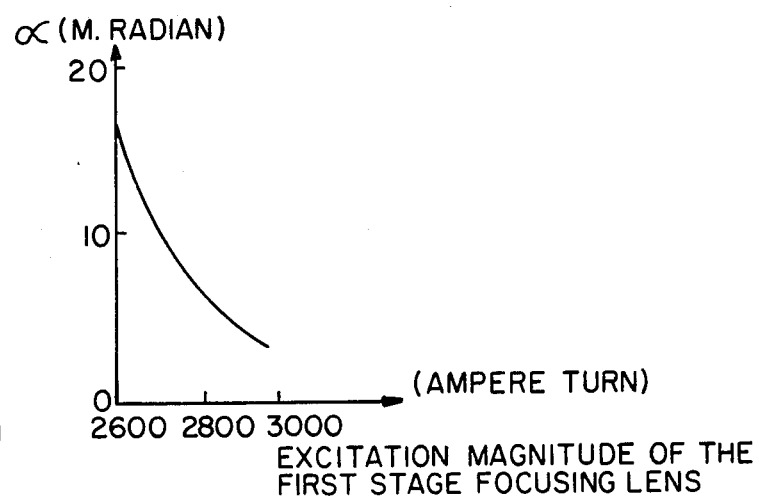
Figure 6B:
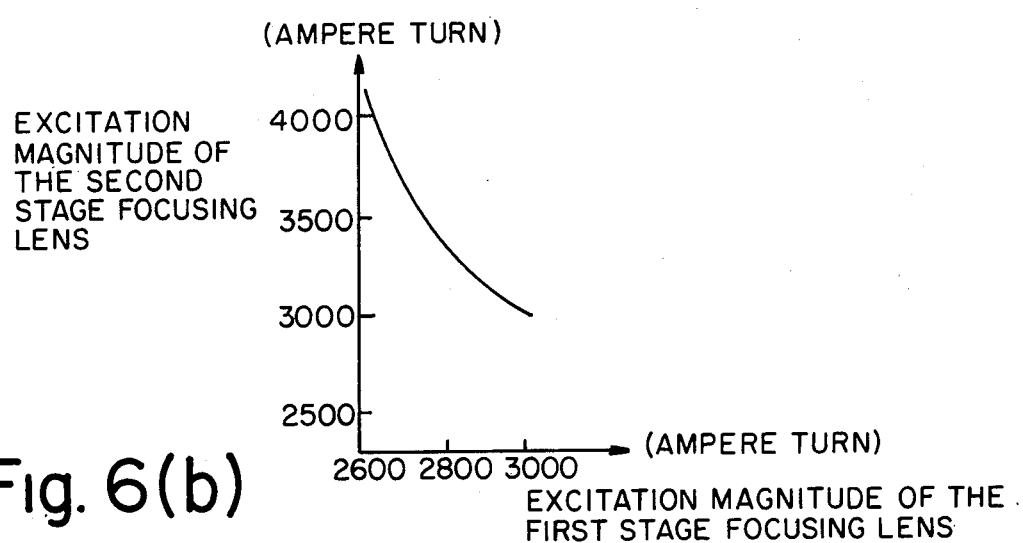
Figure 6C:
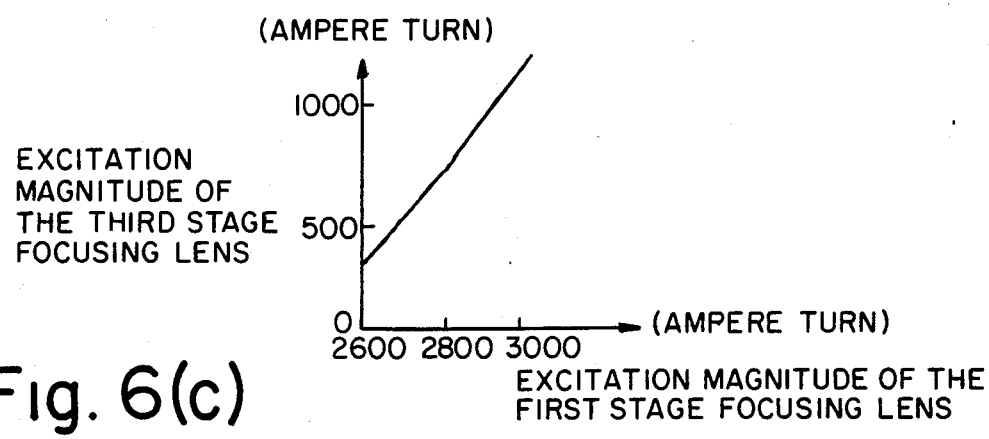

Likewise, FIGS. 6(a), 6(b), and 6(c) are graphs showing the excitation magnitudes of the three stages of focusing lenses which are required to accomplish an arbitrary value of divergence angle $\alpha$ when the spot diameter has been set to about 570 Å. These relations are also stored in the memory 18.

Referring back to FIG. 3, an input device 19 is connected to the arithmetic and control unit 17, and is equipped with a push button 19a for selecting one value for the spot diameter of the electron beam and with a knob 19b for adjusting the divergence angle.

Figure 7:
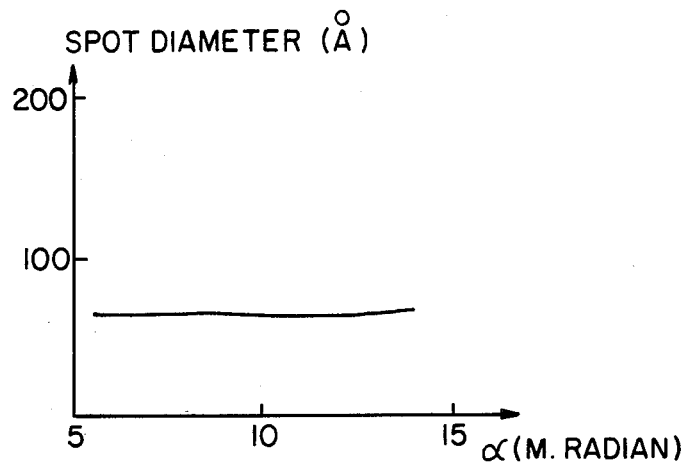
FIGS. 7–9 are graphs showing the diameter of an electron beam spot against various values of divergence angle $\alpha$ when the excitation magnitudes of focusing lenses are controlled according to the graphs of FIGS. 4–6, respectively.
Figure 8:
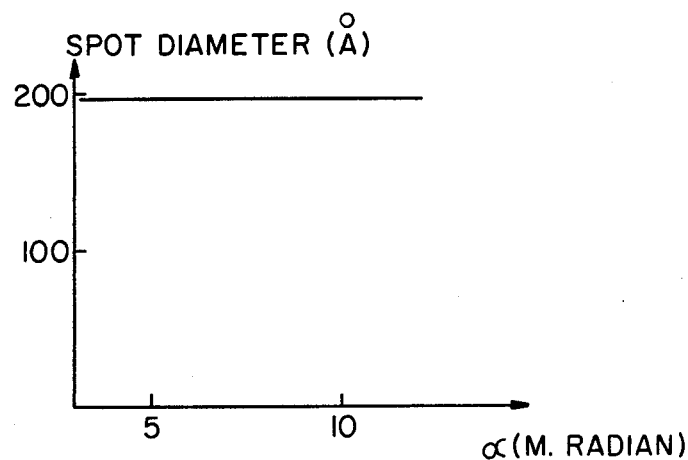
Figure 9:
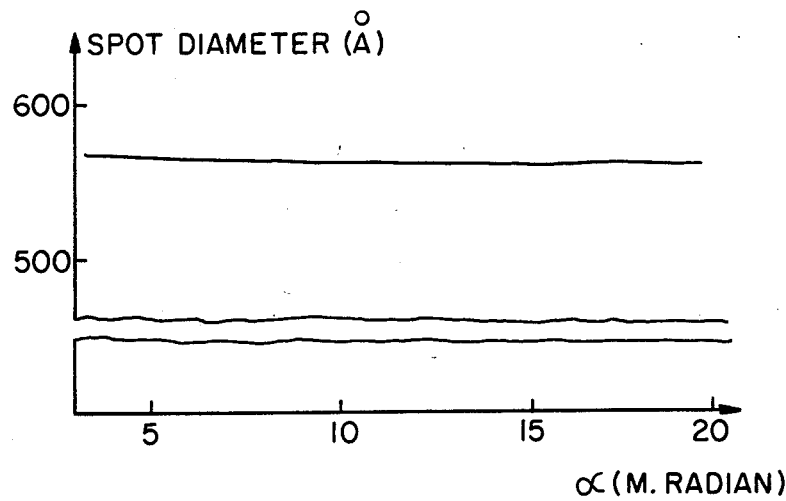

The operation of the instrument constructed as described above is next described. When a diffraction image produced by a focused electron beam is to be observed at an arbitrary divergence angle $\alpha$ while keeping the spot diameter of the electron beam falling on the specimen 7 at a value of, for example, about 70 Å, the operator first places the arithmetic and control unit 17 in the divergence angle control mode so that excitation currents may be delivered from the power supplies 14–16 according to the relations given by the graphs of FIGS. 4(a), 4(b), and 4(c). Then, he rotates the knob 19b while watching the diffraction disks of focused electron beam diffraction images projected onto the fluorescent screen 8, in order to maximize their sizes in such a way that the diffraction disks are not superimposed on one another. At this time, as can be seen from the graph of FIG. 7, it has been empirically found that the diameter of the electron beam spot hardly varies, although the divergence angle $\alpha$ takes various values. In the graph of FIG. 7, the divergence angle $\alpha$ (m radians) is plotted on the horizontal axis and the diameter (Å) of the electron beam spot on the vertical axis. Exactly the same reuslt yields when the divergence angle $\alpha$ is changed while maintaining the spot diameter at another value. Also, as can be seen from the graphs of FIGS. 8 and 9, the spot diameter remains substantially constant irrespective of the changing value of $\alpha$ when the divergence angle is varied as shown in the graphs of FIGS. 5 and 6.

It is to be understood that the foregoing instrument is merely one example of the invention and that various changes and modifications may be made thereto in practicing the invention. In the above example, the excitation magnitudes delivered from the power supplies are controlled according to the information which is stored in the memory in the form of a table of data items. It is also possible to prepare and load a program for calculating the excitation magnitudes of the lenses from various values of $\alpha$ and to control the excitation according to the values obtained by the calculations.

As thus far described, according to the invention, the excitation magnitudes of three stages of focusing lenses are controlled in interrelated manner. Consequently, the divergence angle of an electron beam can be changed at will while maintaining the spot diameter of the beam impinging on a specimen constant. Hence, the size of each diffraction disk can be finely adjusted to maximize it in such a way that diffraction disks are not superimposed on each other. In this way, the best observation can be made of a diffraction image produced by a focused electron beam.

We claim:

1. An electron beam emission and focusing system in an electron microscope comprising an electron gun; first, second, and third stages of focusing lenses for focusing the electron beam from the electron gun; first, second, and third power supplies for respectively exciting the first, second, and third stages of lenses; and an objective lens for focusing the electron beam passed through the three lenses onto a specimen means for interrelatedly controlling the excitation currents supplied to the lenses from the three power supplies to change the divergence angle of the electron beam falling upon the specimen while maintaining the spot diameter of the beam falling upon the specimen constant.

2. In an electron beam focusing system as set forth in claim 1, the further improvement wherein the objective is a magnetic lens and the specimen is in the magnetic field produced by the objective lens.

3. In an electron emission and focusing system as set forth in claim 2, the further improvement wherein the excitation of the objective lens is constant.

4. In an electron beam focusing system as set forth in claim 1, the further improvement wherein said means for interrelatedly controlling the excitation currents reduces the excitation currents of said first and second stages of focusing lenses and increases the excitation of said third stage of focusing to increase the divergence angle of the electron beam.

5. The electron beam focusing system according to claim 1 wherein the excitation currents are controlled to change the divergence angle by maintaining the following relationship:

$$a_3'/(b_2' \cdot b_3') = (1/K)(a_3/(b_2 \cdot b_3))$$

where $a_3$ and $a_3'$ are the before and after object distances of the third focusing lens;
$b_2$ and $b_2'$ are the before and after image distances of the second focusing lens;
$b_3$ and $b_3'$ are the before and after image distances of the third focusing lens; and
K is a constant.

6. The electron beam focusing sytem according to claim 1 wherein excitation currents are controlled to change the divergence angle by maintaining the following relationship:

$$(a_1' \cdot a_2')/b_1' = K(a_1 \cdot a_2)/b_1$$

wherein $a_1$ and $a_1'$ are the before and after object distances of the first focusing lens;
$a_2$ and $a_2'$ are the before and after object distances of the second focusing lens; and
$b_1$ and $b_1'$ are the before and after image distances of the first focusing lens.

7. The electron beam focusing system according to claim 1 wherein the excitation currents are controlled to change the divergence angle by maintaining the following relationship:

$$(a_1' \cdot a_2')/b_1' = K(a_1 \cdot a_2)/b_1 \text{ and}$$

$$a_3'/(b_2' \cdot b_3') = 1/K(a_3/(b_2 \cdot b_3))$$

wherein
$a_n$ = the object distances of the $n^{th}$ focusing lens;
$b_n$ = the image distances of the $n^{th}$ focusing lens;
K = a constant; and
the primes indicated the after change distance.

* * * * *